United States Patent [19]

Spak

[11] Patent Number: 4,885,232
[45] Date of Patent: Dec. 5, 1989

[54] HIGH TEMPERATURE POST EXPOSURE BAKING TREATMENT FOR POSITIVE PHOTORESIST COMPOSITIONS

[75] Inventor: Mark A. Spak, Edison, N.J.

[73] Assignee: Hoechst Celanese Corporation, Somerville, N.J.

[21] Appl. No.: 921,879

[22] Filed: Oct. 17, 1986

Related U.S. Application Data

[63] Continuation of Ser. No. 710,561, Mar. 11, 1985, abandoned.

[51] Int. Cl.$^4$ ................................................. G03F 7/26
[52] U.S. Cl. .................................... 430/326; 430/192; 430/330
[58] Field of Search ........................ 430/330, 326, 192

[56] References Cited

U.S. PATENT DOCUMENTS

| | | | |
|---|---|---|---|
| 3,046,121 | 7/1962 | Schmidt | 430/330 |
| 4,015,986 | 4/1977 | Paal et al. | 430/330 |
| 4,104,070 | 5/1976 | Moritz et al. | 96/36 |
| 4,241,165 | 12/1980 | Hughes et al. | 430/330 |
| 4,439,516 | 3/1984 | Cernigliaro et al. | 430/192 |
| 4,573,782 | 3/1986 | Kobayashi et al. | 354/299 |
| 4,576,901 | 3/1986 | Stahlhofen et al. | 430/330 |

FOREIGN PATENT DOCUMENTS

| | | |
|---|---|---|
| 0021719 | 7/1981 | European Pat. Off. . |
| 0164248 | 11/1985 | European Pat. Off. . |

OTHER PUBLICATIONS

Kaplan, L. H., "Exposure time reduction for positive photoresists", IBM Technical Disclosure Bulletin, vol. 13, No. 2, Jul. 1970.
Jinno et al., "Baking Characteristics of Positive Photoresists"—Photographic Science & Engineering, vol. 21, #5, Sep./Oct. 1977.
Batchelder, T. et al., "Bake Effects in Positive Photoresist"—Solid State Technology—vol. 26 (1983), Aug., #8, pp. 211-217.
Perness et al., "Baking Photoresist to Improve Adhesion"—IBM Technical Disclosure Bulletin—vol. 24, No. 1A, Jun. 1981.
Bergin et al., "Single Layer Optical Lift-Off Process"-–IBM Technical Disclosure Bulletin–vol. 18, No. 5, Oct., 1975, p. 1395.
IBM Technical Disclosure Bulletin, vol. 16, No. 1, 6/1973, p. 47.
Kaplan, L. H., IBM Tech. Discl. Bulletin, vol. 13, No. 2, p. 530, 1970.
Bickford, H. G. et al., IBM Tech. Discl Bulletin, vol. 16, No. 1, p. 47, 6/1973.
Walker, E. J., IEEE Trans. on Electron Devices, vol. 22, ed. 22, No. 7, pp. 464-466, 7/1975.
Allen, R., et al., Accelerated Brief Communications, 6/1982, pp. 1379-1381.
Dill, F. H., et al., IBM Journal of Research and Development, vol. 21, No. 3, pp. 210-218, 5/1977.
DeForest, W. S., "Photoresist Materials and Processes", McGraw-Hill Book Co., 1975, pp. 102, 128, 147-149, & 159-162.
Kaplon, L. H., *IBM Tech. Discl. Bulletin,* vol. 13, No. 2, p. 530, 1970.
Walker, E. J., IEEE Trans. or Electron Devices, vol. 22, ed. 22, No. 7, pp. 464-466, 7/1975.

*Primary Examiner*—Charles L. Bowers, Jr.
*Attorney, Agent, or Firm*—Richard S. Roberts

[57] ABSTRACT

The invention provides a method for producing a photographic element which comprises coating a substrate with a positive working photosensitive composition which composition comprises an aqueous alkali soluble resin, a quinone diazide photosensitizer and a solvent composition, heat treating said coated substrate at a temperature of from about 20° C. to about 100° C. until substantially all of said solvent composition is removed; imagewise exposing said photosensitive composition to actinic radiation; baking said coated substrate at a temperature of from about 120° C. to about 160° C. for from about 15 seconds to about 90 seconds; and removing the exposed non-image areas of said composition with a suitable developer.

15 Claims, No Drawings

HIGH TEMPERATURE POST EXPOSURE BAKING TREATMENT FOR POSITIVE PHOTORESIST COMPOSITIONS

This is a continuation of co-pending application Ser. No. 06/710,561 filed on Mar. 11, 1985, now abandoned.

BACKGROUND OF THE INVENTION

The present invention relates generally to radiation sensitive positive photoresist compositions and particularly to compositions containing novolak resins together with naphthoquinone diazide sensitizing agents.

It is well known in the art to produce positive photoresist formulations such as those described in U.S. Pat. Nos. 3,666,473, 4,115,128 and 4,173,470. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak resin component of these photoresist formulations is soluble in alkaline aqueous solution, but the naphthoquinone sensitizer acts as a dissolution rate inhibitor with respect to the resin. Upon exposure of selected areas of the coated substrate to actinic radiation, however, the sensitizer undergoes a radiation induced structural transformation and the exposed areas of the coating are rendered more soluble than the unexposed areas. This difference in solubility rates causes the exposed areas of the photoresist coating to be dissolved when the substrate is immersed in alkaline developing solution while the unexposed areas are lightly unaffected, thus producing a positive relief pattern on the substrate.

In most instances, the exposed and developed substrate will be subject to treatment by a substrate-etching process. The photoresist coating protects the coated areas of the substrate from the etchant and thus the etchant is only able to etch the uncoated areas of the substrate, which, in the case of a positive photoresist, correspond to the areas that were exposed to actinic radiation. Thus, an etched pattern can be created on the substrate which corresponds to the pattern of the mask, stencil, template, etc., that was used to create selective exposure patterns on the coated substrate prior to development.

The relief pattern of photoresist on substrate produced by the method described above is useful for various applications including, for example, as an exposure mask or a pattern such as is employed in the manufacture of miniaturized integrated electronic components.

The properties of a photoresist composition which are important in commercial practice include the photospeed of the resist, development contrast, resist resolution, thermal stability of the image, process latitude, line width control, clean development, unexposed film loss, and the like.

Increased photospeed is important for a photoresist, particularly in applications where a number of exposures are needed, for example, in generating multiple patterns by a repeated process, or where light of reduced intensity is employed such as, in projection exposure techniques where the light is passed through a series of lenses and mono-chromatic filters. Thus, increased photospeed is particularly important for a resist composition employed in processes where a number of multiple exposures must be made to produce a mask or series of circuit patterns on a substrate. The optimum development conditions include a constant development temperature and time in particular development mode, and a developer composition/resist composition selected to provide complete development of exposed resist areas while maintaining a maximum unexposed resist film thickness loss not exceeding about 10 percent of initial thickness.

Development contrast refers to the slope of the linear portion of the curve resulting from the plot of the log of exposure energy vs. normalized film thickness under fixed development conditions. In use, development of an exposed resist coated substrate is continued until the coating on the exposed area is substantially completely dissolved away.

Resist resolutions refers to the capability of a resist system to reproduce the smallest equally spaced line pairs on intervening spaces of a mask which is utilized during exposure with a high degree of image edge acuity in the developed exposed spaces.

In many industrial applications, particularly in the manufacture of miniaturized electronic components, a photoresist is required to provide a high degree of resolution for very small line and space widths (on the order of one micron or less).

The ability of a resist to reproduce very small dimensions, on the order of a micron or less, is extremely important in the production of large scale integrated circuits on silicon chips and similar components. Circuit density on such a chip can only be increased, assuming photolithography techniques are utilized, by increasing the resolution capabilities of the resist. Although negative photoresists, wherein the exposed areas of resist coating become insoluble and the unexposed areas are dissolved away by the developer, have been extensively used for this purpose by the semiconductor industry, positive photoresists have inherently higher resolution and are utilized as replacements for the negative resists.

Post exposure baking, also known as diffusion baking or deferred baking, has been widely accepted in the integrated circuit industry as a means of reducing standing wave effects in positive photoresists which is an inherent problem with monochromatic exposure and reflective surfaces. The basic process involves a bake cycle after exposure, but prior to development. A typical sequence is a soft bake of 50°–70° C., exposure, a post exposure make up to 110° C., followed by development.

It was originally suggested by E. J. Walker, IEEE Transactions on Electronic Devices, Vol. ED 22, No. 7, p. 464, July 1975 that thermal treatment of positive photoresists after exposure and prior to development may improve lithographic properties and reduce interference patterns resulting from monochromatic exposure of reflective surfaces. The mechanism proposed involved the diffusion of nonphotolized sensitizer from areas of destructive interference, where the concentration of sensitizer is at a local maximum, to areas of constructive interference, where the concentration of sensitizer is a local minimum. Locally uniform dissolution rates of photoresist in the developer were observed when temperatures for post exposure baking exceeded the temperature of soft bake. Lithographic improvements were found in working resolution and process latitude, that is the relation between line width and exposure energy. However, some undesirable changes in photospeed and slope were associated with the process as presented.

The soft bake employed by Walker was 90° C. following by a 100° C. post exposure bake. A modified process was later described by Dill and Shaw IBM J. Res. Develop., p 210, May 1977, and Arnold and Levison, Proceedings of Symposium Kodak Interface 1983, San Diego, Ca, p. 80, where a softbake in the 50°–70° C. range was followed by a 90°. The lower post exposure bake essentially eliminated deleterious impact on photospeed and image slope, while the lower soft bake preserved the benefits observed by Walker.

In the process of the present invention, the post exposure baking of the positive photoresist is conducted at a much higher temperature, for example, 150° C. It has been unexpectedly found that several benefits from the use of a high temperature post exposure bake emerge. These include:

Improved contrast, photolithographic process latitude and working resolution.

Thermal stability of developed photoresist image at least equal to the high temperature post exposing bake temperature.

Improved control of standing waves and other reflective phenomena, such as diffraction.

Substantial elimination of micro-peeling and residue problems common to metal ion free developers.

SUMMARY OF THE INVENTION

The invention provides a method for producing a photographic element which comprises a substrate with a positive working photosensitive composition which composition comprises an aqueous alkali soluble resin, a quinone diazide photosensitizer and a solvent composition, heat treating said coated substrate at a temperature of from about 20° C. to about 100° C. until substantially all of said solvent composition is removed; imagewise exposing said photosensitive compositve composition to actinic radiation, baking said coated substrate at a temperature of from about 120° C. to about 160° C. for from about 15 seconds to about 90 seconds; and removing the exposed non-image areas of said composition with a suitable developer.

DETAILED DESCRIPTION OF THE PREFERRED EMBODIMENT

As a first step in the production of the photographic element of the present invention, one coats and dries a photosensitive composition on a suitable substrate. The composition contains an aqueous alkali soluble binding resin and a quinone diazide photosensitizer. The preferred alkali soluble binding resins include the class known as the novolaks.

The production of novolak resins, which may be used for preparing photosensitive compositions, is well known in the art. A procedure for their manufacture is described in *Chemistry and Application of Phenolic Resins*, Knop A. and Scheib, W.; Springer Verlag, New York, 1979 in Chapter 4 which is incorporated herein by reference. Similarly, the use of o-quinone diazides is well known to the skilled artisan as demonstrated by *Light Sensitive Systems*, Kosar, J.; John Wiley & Sons, New York, 1965 in Chapter 7.4 which is also incorporated herein by reference. These sensitizers which comprise a component of the present resist compositions of the present invention are preferably selected from the group of substituted naphthoquinone diazide sensitizers which are conventionally used in the art in positive photoresist formulations. Such sensitizing compounds are disclosed, for example, in U.S. Letters Pat. Nos. 2,797,213; 3,106,465; 3,148,983; 3,130,047; 3,201,329; 3,785,825; and 3,802,885, which are incorporated herein by reference. Useful photosensitizers include (1,2)naphthoquinonediazide-5-sulfonyl chloride, condensed with phenolic compounds such as hydroxy benzophenones especially trihydroxybenzophenone and more particularly 2,3,4 trihydroxybenzophenone.

The photosensitive composition is formed by blending the ingredients in a suitable solvent composition in the preferred embodiment, the solid parts of the photoresist composition, that is the novolak and diazide preferably ranges from 15% to about 99% novolak resin and from about 1% to about 85% quinone diazide. A more preferred range of novolak resin would be from about 50% to about 90% and most preferably from about 65% to about 85% by weight of the solid resist parts. A more preferred range of the diazide would be from about 10% to about 50% and more preferably from about 15% to about 35% by weight of the solid resist parts. In manufacturing the resist composition the novolak and diazide are mixed with such solvents as the propylene glycol alkyl ether acetate, butyl acetate, xylene ethylene glycol monoethyl ether acetate, and propylene glycol mono-alkyl ether acetate, among others.

Additives such as colorants, dyes, anti-striation agents, leveling agents, plasticizers, adhesion promoters, speed enhancers, solvents and such surfactants as non-ionic surfactants may be added to the solution of novolak resin, sensitizer and solvent before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, bases on the combined weight of novolak and sensitizer. The dye additives help provide increased resolution by inhibiting back scattering of light off the substrate.

Anti-striation agents may be used to five percent weight level, based on the combined weight of novolak and sensitizer. Plasticizers which may be used include, for example, phosphoric acid tri-($\beta$-chloroethyl)-ester; stearic acid; dicamphor; polypropylene; acetal resins; phenoxy resins; and alkyl resins at one to ten percent weight levels, based on the combined weight of novolak and sensitizer. The plasticizer additives improved the coating properties of the material and enable the application of a film that is smooth and of uniform thickness to the substrate.

Adhesion promoters which may be used include, for example, $\beta$-(3,4-epoxy-cyclohexyl)-ethyltrimethoxysilane; p-methyldisilane-methyl methacrylate; vinyltrichlorosilane; and $\gamma$-amino-propyl triethoxysilane up to a 4 percent weight level, based on the combined weight of novolak and sensitizer.

Speed enhancers that may be used include, for example, picric acid, nicotinic acid or nitrocinnamic acid at a weight level of up to 20 percent, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

The coating solvents may be present in the overall composition in an amount of up to 95% by weight of the solids in the composition.

Non-ionic surfactants that may be used include, for example, nonylphenoxy poly(ethyleneoxy) ethanol; octylphenoxy (ethyleneoxy) ethanol; and dinonyl phenoxy poly(ethyleneoxy) ethanol at up to 10 percent weight levels, based on the combined weight of novolak and sensitizer.

The prepared resist solution, can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters.

After the resist composition solution is coated onto the substrate, the substrate is temperature treated at approximately 20° to 100° C. This temperature treatment is selected in order to reduce and control the concentration of residual solvents in the photoresist while not causing substantial thermal degradation of the photosensitizer. In general one desires to minimize the concentration of solvents and thus this first temperature treatment is conducted until substantially all of the solvents have evaporated and a thin coating of photoresist composition, on the order of a micron in thickness, remains on the substrate. In a preferred embodiment the temperature is conducted at from about 50° C. to about 90° C. A more preferred range is from about 70° C. to about 90° C. The treatment is conducted until the rate of change of solvent removal becomes relatively insignificant. The temperature and time selection depends on the resist properties desired by the user as well as equipment used and commercially desired coating times. Commercially acceptable treatment times for hot plate baking are those up to about 3 minutes, more preferably up to about 1 minutes. In one example, a 30 second treatment at 90° is useful. The coating substrate can then be exposed to actinic radiation, especially ultraviolet radiation, in any desired pattern, produced by use of suitable masks, negatives, stencils, templates, etc.

The resist is then subjected to a post exposure second baking or heat treatment of from about 120° C. to about 160° C., preferably 130° C. to 160° C., more preferably 140° C. to 160° C., still more preferably about 140° C. to about 155° C. This baking treatment is conducted with a hot plate system for from about 15 seconds to about 90 seconds, more preferably for from about 30 seconds to about 90 seconds.

The selection of the first and second heat treatment temperatures and first and second heat treatment times may be selected and optimized by the properties which are desired by the end user. In general, the lower the temperature of the first heat treatment within its range, the lower the required temperature of the second heat treatment within its range. However, again, the user must optimize the conditions according to his application. For example, if the user desired to minimize the effects of reflective notching, he might use the temperatures at the lower end of the preferred range for the first bake and the higher end of the preferred range for the second bake. However, if the user desired more enhanced thermal stability of the developed image, he would operate at the upper end of the preferred range for both bakes. In effect the user can regulate thermal stability which is good at least up to the post exposure bake temperature selected.

The exposed resist-coated substrates are next substantially immersed in alkaline developing solution. The solution is preferably agitated, for example, by nitrogen burst agitation. The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The resist compositions of the present invention are resistant to acid-base etching solutions and provide effective protection for the unexposed resist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Two photoresist formulations are prepared as follows:

| Photoresist A | | Photoresist B | |
|---|---|---|---|
| Resin | 23.8% | Resin | 23.8% |
| Sensitizer A | 7.0% | Sensitizer B | 3.0% |
| Solvent | 69.2% | Solvent | 73.2% |

The resin is a cresol-formaldehyde novolak resin made by acidic condensation of a cresol mixture consisting primarily of equal amounts of para and metal cresol with aqueous formaldehyde to achieve a molecular weight of approximately 4000 after water removal, as measured by gel permeating chromatography. The resin has a viscosity of approximately 650 centistokes at 40% solids in ethyleneglycol monoethylether at 25° C.

Sensitizers A and B are reaction products of 1,2 naphthoquinone diazide-5-sulfonyl chloride and 2,3,4 trihydroxybenzophenone where the average degree of substitution for A is 2.0 and for B is approximately 3. Thus, A is a mixture of several isomers and B is a substantially pure trisubstituted compound.

The solvent system is by weight 80% ethyleneglycol monoethylether acetate, 10% n-butyl acetate and 10% xylene.

The resin is dissolved by stirring into the solvent system. After the resin is dissolved, the sensitizers are added slowly with agitation and allowed to dissolve completely. The resulting photoresist solutions are filtered to remove particulate matter.

EXAMPLE 2

Two silicon wafers substrates suitable for integrated circuit manufacture are treated with an adhesion promoter, namely hexamethyldisilazane. Each of these wafers is spin coated with photoresist A from Example 1 until a 1.8 micron thick film is attained. Both wafers are subjected to a heat treatment at 90° C. for 30 minutes in a convection oven. They are then exposed to 120 mJ/cm$^2$ of actinic radiation through a resolution test mask. Wafer 1 is subsequently baked at 140° C. for 45 seconds on a hot plate system whereas Wafer 2 is not baked. Both of the wafers are then developed with a 0.54N aqueous alkaline developer having a pH>12.0, namely AZ Developer, which is commercially available from the AZ Photoresist Products Group of American Hoechst Corporation, Somerville, N.J. Development time for Wafer 1 is 60 seconds and that for Wafer 2 is 30 seconds.

Wafer 2, which is produced according to a standard process is placed in a scanning electron microscope (SEM) and two micron size lines are observed. We can see at 10,000 times magnification wall profiles of 85°. Wafer 1 is then placed in the SEM and two micron size features are also observed and it has a slope in the photoresist lines of about 65° C. A thermal stability test is then performed as follows: Each wafer is placed in a bake oven where the temperature is adjusted to 140° C. After thirty minutes of baking, the wafers are removed and the resist patterns are examined again under the SEM at the magnification and tilt angle as before. It is observed that the two micron features on Wafer 2 have changed size and slope. The size of two micron lines is now measured to be 2.4 to 2.6 microns. The slope of the lines appear to be irregular. Wafer 1 is then placed in the SEM and the two micron features are observed again. Both the size and slope remain unchanged.

EXAMPLE 3

Two silicon wafers substrates suitable for integrated circuit manufacture are treated with an adhesion promoter, namely hexamethyldisilazane. Each of these wafers is spin coated with photoresist B from Example 1 at a spin speed of 4000 R.P.M. so that a 2 micron thick film is attained. Both wafers are subjected to a heat treatment at 90° C. for 30 minutes in a convection oven. They are then exposed to 80 mJ/cm$^2$ of actinic radiation through a test mask. Wafer 1 is subsequently baked on a hot plate system at 150° C. for 45 seconds whereas Wafer 2 is not baked. Wafer 2 represents a conventional process. Both of the wafers are then developed with a 0.15N aqueous alkaline developer, namely AZ421K, which is commericially available from the AZ Photoresist Products Group of American Hoechst Corporation, Somerville, N.J. Development time for Wafer 1 is 300 seconds and that for Wafer 2 is 60 seconds.

Wafer 2 which is produced by a standard process is placed in a scanning electron microscope (SEM) and two micron size lines are observed. At 10,000 times magnification one can see the diffraction pattern present at the photoresist top surface propagating more than half its thickness toward the substrate.

Wafer 1 is now placed in the SEM and two micron size features are also observed. Smooth surfaces of defined features are noted and diffraction patterns observable in the conventional process substantially eliminated.

A thermal stability test is now performed as follows: Wafer 1 and Wafer 2 are placed in a bake oven where the temperature is adjusted to 150° C. After thirty minutes of baking, the wafers are removed and the resist patterns are examined under the SEM at the same magnification and tilt angle as before. It is observed that the two micron features on Wafer 2 have changed size. The size of the two micron lines is now measured to be 2.8 microns. Wafer 1 is then placed into the SEM and the two micron lines are observed. No changes in size are induced by the thermal treatment are noted, indicating the 150° post exposure bake process has improved the thermal stability.

EXAMPLE 4

Two silicon wafers substrates for integrated circuit manufacture are treated with an adhesion promoter, namely hexamethyldisilazane. Each of these wafers is spin coated with photoresist B from Example 1 at a spin speed of 4000 R.P.M. so that a 2 micron thick film is attained. Both wafers are subjected to a heat treatment at 90° C. for 30 minutes in a convection oven. They are then exposed to actinic radiation through a test mask. Wafer 1 is subsequently baked at 150° C. for 45 seconds on a hot plate system whereas Wafer 2 is not baked. Wafer 2 represents a conventional process. Both of the wafers are then developed with a metal ion free aqueous alkaline developer containing tetramethyl ammonium hydroxide, namely AZ427 MIF, which is commercially available from the AZ Photoresist Products Group of American Hoechst Corporation, Somerville, N.J.

Processing conditions and resultant properties of the resists are as follows:

|  | Wafer 1 | Wafer 2 |
| --- | --- | --- |
| Developer Concentration | 0.32 N | 0.27 N |
| Development Time | 120 seconds | 180 seconds |
| Photospeed mJ/cm$^2$ | 80 | 115 |
| Contrast | 2.9 | 1.5 |
| Rate of Unexposed Resist Loss | <100 | 800 |

The post exposure bake process significantly improved photospeed, contrast and unexposed resist loss as indicated in the data above. Additionally, no residue or micropeeling are observed in SEM evaluations of the images by the Wafer 1 process. This example indicates the flexibility of the process with respect to photospeed and contrast. Development time varies inversely with developer concentration.

What is claimed is:

1. A method for producing a photographic element which consists essentially of coating a substrate with a positive working photosensitive composition which composition comprises an aqueous alkali soluble resin, a quinone diazide photosensitizer and a solvent composition, then heat treating said coated substrate at a temperature of from about 20° C. to about 100° C. until substantially all of said solvent composition is removed; then imagewise exposing said photosensitive composition to actinic radiation; then baking said coated substrate at a temperature of from at least about 130° C. to about 155° C. for from about 15 seconds to about 90 seconds; and the removing the exposed non-image areas of said composition with a developer until substantially all of the coating has dissolved from the exposed areas, which developer consists essentially of an aqueous alkaline solution to attain an image having thermal stability at least equal to the temperature of said baking step.

2. The method of claim 1 wherein said heat treating step is conducted at a temperature of from about 50° C. to about 90° C.

3. The method of claim 1 wherein said heat treating step is conducted at a temperature of from about 70° C. to about 90° C.

4. The method of claim 1 wherein said heat treatment is conducted for up to about 3 minutes.

5. The method of claim 1 wherein said heat treatment is conducted for up to about 1 minute.

6. The method of claim 1 wherein said baking treatment is conducted at a temperature of from about 140° C. to about 155° C.

7. The method of claim 1 wherein said baking treatment is conducted for from about 30 seconds to about 90 seconds.

8. The method of claim 1 wherein said heat treatment is conducted at from about 85° C. to about 95° C. for up to about one minute; and said post exposure baking treatment is conducted at a temperature of from about 140° C. to about 155° C. for from about 30 seconds to about 90 seconds.

9. The method of claim 1 wherein said photosensitive composition further comprises one or more additives selected from the group consisting of colorants, leveling agents, anti-striation agents, plasticizers, adhesion promoters, speed enhancers, solvents and surfactants.

10. The method of claim 1 wherein said diazide component comprises one or more compounds selected from the group consisting of diazo sulfonyl-chloride reaction products with hydroxy or polyhydroxy aryl compounds, aryl amines or polyamines.

11. The method of claim 1 wherein said substrate comprises one or more components selected from the group consisting of silicon, aluminum, polymeric resins, silicon dioxide, doped silicon dioxide, silicon nitride, tantalum, copper, polysilicon, ceramics and aluminum/copper mixtures.

12. The method of claim 1 wherein said photosensitizer is the condensation product of (1,2)naphthoquinonediazide-5-sulfonyl chloride with 2,3,4 trihydroxybenzophenone.

13. The method of claim 1 wherein said resin is a novolak resin.

14. The method of claim 1 wherein said solvent composition comprises one or more compounds selected from the group consisting of xylene, butyl acetate, ethylene glycol monoethyl ether acetate and propylene glycol mono-alkyl ether acetate.

15. The photographic element produced according to the method of claim 1.

* * * * *